(12) United States Patent
Nezuka et al.

(10) Patent No.: US 11,899,044 B2
(45) Date of Patent: Feb. 13, 2024

(54) CURRENT SENSOR

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Tomohiro Nezuka, Nisshin (JP); Yoshikazu Furuta, Nisshin (JP); Shotaro Wada, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 0 days.

(21) Appl. No.: 17/875,547

(22) Filed: Jul. 28, 2022

(65) Prior Publication Data
US 2023/0055691 A1   Feb. 23, 2023

(30) Foreign Application Priority Data
Aug. 17, 2021   (JP) .................................. 2021-132748

(51) Int. Cl.
*G01R 33/04* (2006.01)
*G01R 15/14* (2006.01)
(Continued)

(52) U.S. Cl.
CPC ........... *G01R 15/146* (2013.01); *G01R 1/071* (2013.01); *G01R 15/242* (2013.01);
(Continued)

(58) Field of Classification Search
CPC .. G01R 15/146; G01R 19/0092; G01R 27/02; G01R 33/04; G01R 33/045; G01R 33/02; G01C 17/30; G01C 17/28; G01C 17/38
(Continued)

(56) References Cited

U.S. PATENT DOCUMENTS 6,909,275 B2   6/2005   Hartzsch
8,779,777 B2   7/2014   Irmer et al.
(Continued)

FOREIGN PATENT DOCUMENTS

| DE | 10310503 A1 | 9/2004 |
|---|---|---|
| JP | S62-168049 A | 7/1987 |
| JP | S62-168067 A | 7/1987 |

OTHER PUBLICATIONS

U.S. Appl. No. 17/875,677, filed Jul. 28, 2022, Nezuka et al.
(Continued)

*Primary Examiner* — Raul J Rios Russo
(74) *Attorney, Agent, or Firm* — POSZ LAW GROUP, PLC

(57) ABSTRACT

A current sensor for a detection target current using a shunt resistor includes: a resistance value correction circuit having a correction resistor; a signal application unit that applies an alternating current signal to a series circuit of the shunt resistor and the correction resistor; a voltage detection unit that detects terminal voltages of the shunt resistor and the correction resistor; and a correction unit that calculates a resistance value of the shunt resistor and corrects the resistance value for detection; and a power supply circuit having a first power supply generation unit that generates a first power supply of the signal application unit from an input power supply of an outside; and a second power supply generation unit that generates a second power supply of the voltage detection unit.

6 Claims, 14 Drawing Sheets

(51) Int. Cl.
*G01R 27/02* (2006.01)
*G01R 19/00* (2006.01)
*G01R 15/24* (2006.01)
*G01R 1/07* (2006.01)
*G01R 33/02* (2006.01)
*G01C 17/30* (2006.01)
*G01C 17/28* (2006.01)
*G01C 17/38* (2006.01)

(52) U.S. Cl.
CPC ....... *G01R 15/246* (2013.01); *G01R 19/0092* (2013.01); *G01R 27/02* (2013.01); *G01R 33/02* (2013.01); *G01R 33/04* (2013.01); *G01R 33/045* (2013.01); *G01C 17/28* (2013.01); *G01C 17/30* (2013.01); *G01C 17/38* (2013.01)

(58) Field of Classification Search
USPC ............ 324/51, 55, 200, 227, 228, 244, 253
See application file for complete search history.

(56) References Cited

U.S. PATENT DOCUMENTS

| | | | |
|---|---|---|---|
| 8,947,101 | B2 | 2/2015 | Engl |
| 9,632,163 | B2 | 4/2017 | Mueller et al. |
| 10,473,724 | B2 | 11/2019 | Aumer et al. |
| 2008/0157752 | A1* | 7/2008 | Lu ....................... G01R 15/146 324/140 R |
| 2013/0009655 | A1 | 1/2013 | Marten |
| 2015/0268277 | A1 | 9/2015 | Marten |
| 2016/0291060 | A1* | 10/2016 | Wood ..................... G01R 15/04 |
| 2017/0003322 | A1* | 1/2017 | Nakamura ........... G01R 15/146 |
| 2017/0089955 | A1* | 3/2017 | Yugou .................. B60L 3/0038 |

OTHER PUBLICATIONS

Office Action dated Jun. 20, 2023 issued in the related U.S. Appl. No. 17/875,677.
Notice of Allowance dated Aug. 2, 2023 issued in the related U.S. Appl. No. 17/875,677.

\* cited by examiner

CURRENT SENSOR

CROSS REFERENCE TO RELATED APPLICATIONS

The present application claims the benefit of priority from Japanese Patent Application No. 2021-132748 filed on Aug. 17, 2021. The entire disclosure of the above application is incorporated herein by reference.

TECHNICAL FIELD

The present disclosure relates to a current sensor that detects a detection target current by using a terminal voltage of a shunt resistor provided in series in a path through which the detection target current flows and a resistance value for current detection corresponding to the resistance value of the shunt resistor.

BACKGROUND

In the conceivable current sensor, the terminal voltage of the shunt resistor provided in series with the path through which the detection target current flows is measured, and the current as thee detection target is calculated based on the measured voltage and the resistance value for current detection corresponding to the resistance value of the shunt resistor. In this case, since the resistance value of the shunt resistor may change due to deterioration over time or the like, it may be necessary to correct the resistance value for current detection used for calculating the current at any time. In the following description, the conceivable current sensor according to a first technique will be referred to as a first conceivable technique, and the conceivable current sensor according to a second technique will be referred to as a second conceivable technique.

In the first conceivable technique, the resistance value for current detection is corrected as follows. That is, the first conceivable technique provides a sub-resistor provided so that a detection target current flows in the sub-resistor, similar to the shunt resistor in a normal state, and a correction resistor provided so that a detection target current does not flow in the correction resistor in a normal time. According to the above configuration, the sub-resistor deteriorates with time similar to the shunt resistor, but the correction resistor hardly deteriorates with time. In the first conceivable technique, the degree of deterioration of the sub-resistor and the shunt resistor is obtained by comparing the resistance value of the sub-resistor and the correction resistor at the time of correction, and the resistance value for current detection is corrected based on the deterioration degree.

In the second conceivable technique, the resistance value for current detection is corrected as follows. That is, the second conceivable technique has a configuration in which a plurality of shunt resistors are provided and a correction current is passed from the interconnection nodes of the plurality of shunt resistors, or an input terminal is provided in the central portion of the shunt resistor and a correction current is passed from the input terminal. In the second conceivable technique, the terminal voltage of each resistor when a correction current is passed is measured, and the individual resistance value is calculated based on the measurement result to correct the resistance value for current detection.

SUMMARY

According to an example, a current sensor for a detection target current using a shunt resistor includes: a resistance value correction circuit having a correction resistor; a signal application unit that applies an alternating current signal to a series circuit of the shunt resistor and the correction resistor; a voltage detection unit that detects terminal voltages of the shunt resistor and the correction resistor; and a correction unit that calculates a resistance value of the shunt resistor and corrects the resistance value for detection; and a power supply circuit having a first power supply generation unit that generates a first power supply of the signal application unit from an input power supply of an outside; and a second power supply generation unit that generates a second power supply of the voltage detection unit.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
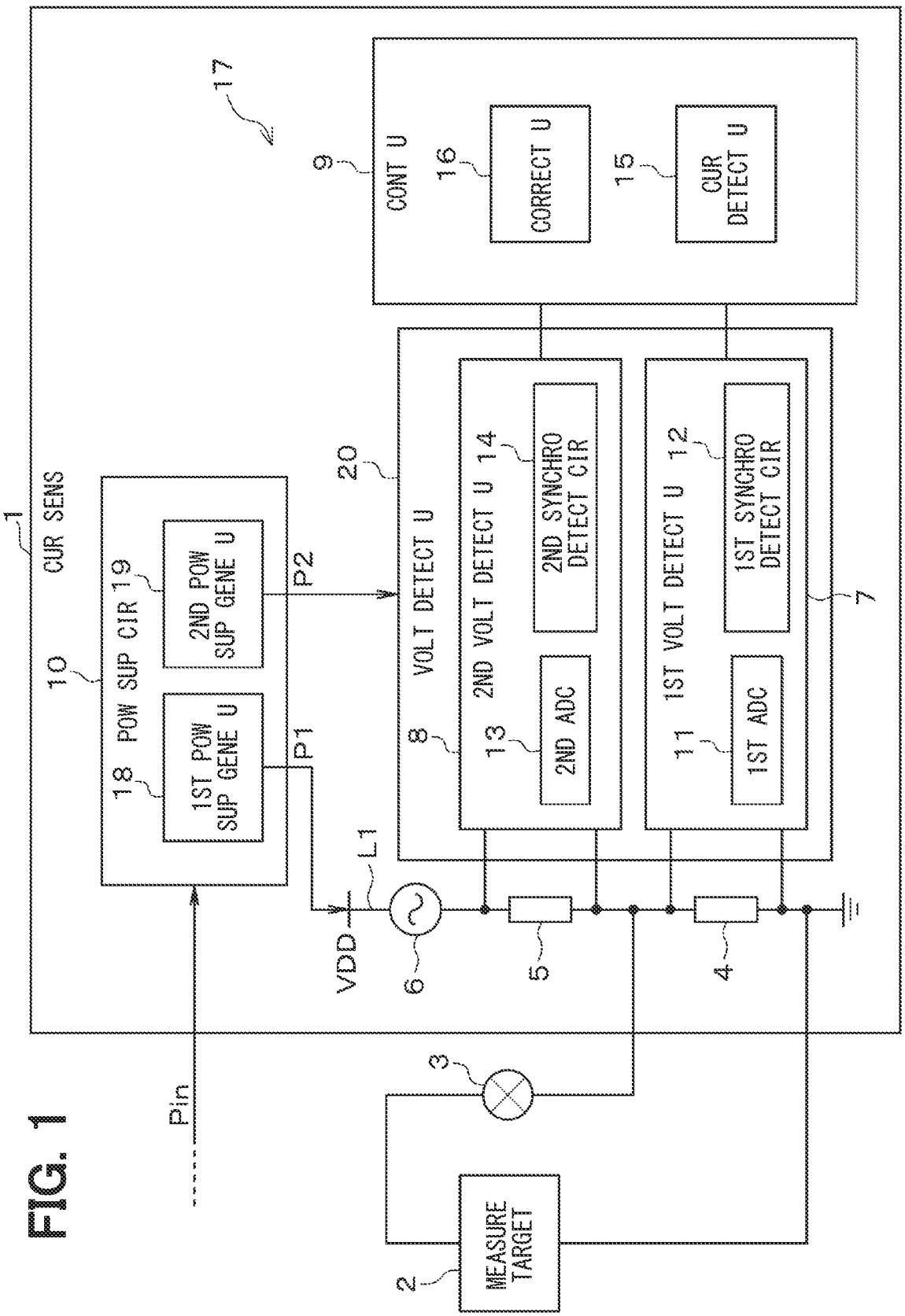
FIG. 1 is a diagram schematically showing a configuration of a current sensor according to a first embodiment.

In the first conceivable technique, the shunt resistor is not used for direct correction, and it is assumed that the sub-resistor deteriorates in the same manner as the shunt resistor, and then the sub-resistor is used to indirectly correct the resistance value for the current detection corresponding to the resistance value of the shunt resistor. Therefore, in the first conceivable technique, if the above assumption is not satisfied, the resistance value for current detection may not be corrected with high accuracy, and as a result, the current detection accuracy may decrease.

In the second conceivable technique, since it is necessary to provide a plurality of shunt resistors or to provide an input terminal in the central portion of the shunt resistor, there arises a difficulty that the configuration becomes complicated. Further, in the second conceivable technique, it is difficult to sufficiently improve the accuracy of the correction because the accuracy of the correction of the resistance value for current detection greatly depends on the accuracy of the correction current. Further, in both the first conceivable technique and the second conceivable technique, in order to improve the accuracy of the correction of the resistance value for detection, it is necessary to increase the current flowing during the correction, but when the current flowing during the correction is increased, a difficulty such as heat generation and increased power consumption may occur.

The present embodiments have been made in view of the above circumstances, and an object of the present embodiments is to provide a current sensor capable of accurately correcting the resistance value for detection and suppressing power consumption without complicating the configuration.

A current sensor detects a detection target current using a terminal voltage of a shunt resistor provided in series in a path through which the detection target current flows and a resistance value for current detection corresponding to the resistance value of the shunt resistor. The current sensor includes: a resistance value correction circuit for correcting the resistance value for detection and a power supply circuit for supplying power to the resistance value correction circuit. The resistance value correction circuit includes a correction resistor, a signal application unit, a voltage detection unit, and a correction unit. The correction resistor is connected in series with the shunt resistor in a path different from the path through which the detection target current flows. The signal application unit applies an AC signal to the series circuit of the shunt resistor and the correction resistor. The voltage detection unit detects the terminal voltages of the shunt resistor and the correction resistor when the AC signal is applied to the series circuit. The correction unit calculates the resistance value of the shunt resistor based on each detection value of the terminal voltages by the voltage detection unit, and corrects the resistance value for detection based on the calculation resistance value which is the calculated resistance value of the shunt resistor.

According to the resistance value correction circuit having such a configuration, the resistance value for detection is directly corrected by using the shunt resistor without indirectly correcting the resistance value for detection by using the sub-resistance as in the first conceivable technique. As a result, the accuracy of correction of the resistance value for detection is improved. Further, according to the above configuration, unlike the second conceivable technique, it is not necessary to provide a plurality of shunt resistors nor to provide an input terminal at the center of the shunt resistors, and only one shunt resistor needs to be provided, so that the configuration of the entire current sensor is not complicated.

In the resistance value correction circuit having the above configuration, the larger the level of the AC signal applied to the series circuit of the shunt resistor and the correction resistor, the higher the detection accuracy of each terminal voltage by the voltage detection unit, and eventually the correction accuracy of the resistance value for detection is improved. In this case, the power supply circuit is configured to include: a first power supply generation unit, which generates a first power supply having a low voltage with respect to the input power supply by stepping down the input power supply supplied from the outside; and a second power supply generation unit for generating a second power supply different from the first power supply, so that the power supply circuit supplies the first power supply to the signal application unit and the second power supply to the voltage detection unit.

As described above, in the above configuration, since the signal application unit operates by receiving the supply of the first power supply generated by stepping down the input power supply, the power supply voltage can be lowered while the output current is increased. That is, it is possible to increase the level of the AC signal applied to the series circuit of the shunt resistor and the correction resistor. Therefore, according to the above configuration, it is possible to obtain an excellent effect that the resistance value for detection can be corrected with high accuracy and the power consumption can be suppressed to a low level without complicating the configuration of the entire current sensor.

Hereinafter, multiple embodiments will be described with reference to the drawings. In each embodiment, the substantially same components are denoted by the same reference numerals and description thereof will be omitted.

First Embodiment

The first embodiment of the present disclosure is described with reference to FIGS. 1 to 11.

(General Configuration)

The current sensor 1 of the present embodiment shown in FIG. 1 is mounted on a vehicle such as an automobile, and detects a detection target current which is a current flowing through the measurement target 2. The measurement target 2 may be a battery such as a main engine battery that supplies electric power to a drive unit for traveling a vehicle, an auxiliary battery that supplies electric power to an auxiliary device of the vehicle, a DC/DC converter, and the like. The DC/DC converter supplies electric power to a motor that generates a driving force for driving a vehicle, and constitutes the above-mentioned driving unit together with the motor.

In this case, the load 3 is connected in series to the measurement target 2, and the loop circuit is configured by the measurement target 2, the load 3, a switch (not shown), and the like. When the measurement target 2 is the above-mentioned battery, the load 3 may be, for example, the above-mentioned motor, the above-mentioned DC/DC converter, the electric compressor, or the like. Further, when the measurement target 2 is the above-mentioned DC/DC converter, the load 3 may be, for example, the above-mentioned motor or the like.

The current sensor 1 includes a shunt resistor 4, a correction resistor 5, a signal application unit 6, a first voltage detection unit 7, a second voltage detection unit 8, a control unit 9, and a power supply circuit 10. One terminal of the shunt resistor 4 is connected to the high potential side terminal of the measurement target 2 via the load 3, and the other terminal is connected to the ground which is the reference potential of the circuit and the low potential side terminal of the measurement target 2. That is, the shunt resistor 4 is provided in series with the path through which the detection target current flows. The current sensor 1 detects the detection target current using the terminal voltage of the shunt resistor 4 provided in this way and the resistance value for detection corresponding to the resistance value of the shunt resistor 4.

One terminal of the correction resistor 5 is connected to the signal application unit 6, and the other terminal is connected to the one terminal of the shunt resistor 4. That is, the correction resistor 5 is connected in series with the shunt resistor 4 in a path different from the path through which the detection target current flows. In this case, since the detection target current is a relatively large current, the resistance value of the shunt resistor 4 is a relatively small value, for example, on the order of pΩ.

On the other hand, since a relatively large detection target current does not flow through the correction resistor 5, its resistance values are relatively large, for example, on the order of mΩ. In general, it may be difficult to accurately form a resistor having a small resistance value, but it may be relatively easy to accurately form a resistor having a large resistance value. Therefore, in the present embodiment, the resistance accuracy of the correction resistor 5 is sufficiently higher than the resistance accuracy of the shunt resistor 4.

The signal application unit 6 applies a pulse wave or sinusoidal AC signal to the series circuit of the shunt resistor 4 and the correction resistance 5 at the time of correction when the detection resistance value described later is corrected. In other words, the signal application unit 6 applies the same AC signal to the shunt resistor 4 and the correction resistor 5 at the time of correction. In this case, the signal application unit 6 is configured as a current source that operates by being supplied by the first power supply P1 having a power supply voltage VDD of, for example, about +1V generated by the power supply circuit 10. The signal application unit 6 supplies an alternating current from the power supply line L1 to which the first power supply P1 is supplied to the series circuit.

The first voltage detection unit 7 detects the terminal voltage of the shunt resistor 4 when an AC signal is applied to the series circuit of the shunt resistor 4 and the correction resistor 5, and includes the first A/D converter 11 and the first synchronous detection circuit 12. In drawings such as FIG. 1, the A/D converter is abbreviated as ADC. The first A/D converter 11 performs the following A/D conversion operation in order to detect the terminal voltage of the shunt resistor 4. That is, the first A/D converter 11 inputs the signal of each terminal of the shunt resistor 4, and by performing A/D conversion of each signal, outputs the difference in the voltage of each terminal of the shunt resistor 4, that is, the digital signal corresponding to the inter-terminal voltage of the shunt resistor 4. The digital signal output from the first A/D converter 11 in this way is a signal corresponding to the signal of the terminal of the shunt resistor 4.

The first synchronous detection circuit 12 inputs a digital signal output from the first A/D converter 11 and synchronously detects the signal at the same frequency as the AC signal in the signal application unit 6, and extracts the signal. Then, the first synchronous detection circuit 12 outputs the extracted signal to the control unit 9. The output signal of the first synchronous detection circuit 12 is a signal corresponding to the terminal voltage of the shunt resistor 4. In this way, during the correction period, the first voltage detection unit 7 is configured to detect the terminal voltage of the shunt resistor 4 based on the output signal of the first synchronous detection circuit 12, and outputs the signal representing the detection value of the terminal voltage as the first voltage detection value to the control unit 9.

The first voltage detection unit 7 detects the terminal voltage of the shunt resistor 4 as follows when the AC signal is not applied to the series circuit of the shunt resistor 4 and the correction resistor 5, that is, in the normal state. That is, in the normal state, the first A/D converter 11 performs the A/D conversion operation in the same manner as in the correction time. In this case, the digital signal output from the first A/D converter 11 is output to the control unit 9 without being input to the first synchronous detection circuit 12. That is, in the normal state, the first voltage detection unit 7 detects the terminal voltage of the shunt resistor 4 based on the output signal of the first A/D converter 11, and outputs a signal representing the detection value of the terminal voltage as the first voltage detection value to the control unit 9.

The second voltage detection unit 8 detects the terminal voltage of the correction resistor 5 when an AC signal is applied to the series circuit of the shunt resistor 4 and the correction resistor 5, and includes the second A/D converter 13 and the second synchronous detection circuit 14. The second A/D converter 13 performs an A/D conversion operation as follows in order to detect the terminal voltage of the correction resistor 5. That is, the second A/D converter 13 inputs the signal of each terminal of the correction resistor 5, and by performing A/D conversion of each signal, outputs the difference in the voltage of each terminal of the correction resistor 5, that is, a digital signal corresponding to the inter-terminal voltage of the correction resistor 5. The digital signal output from the second A/D converter 13 in this way is a signal corresponding to the signal of the terminal of the correction resistor 5.

The second synchronous detection circuit 14 inputs a digital signal output from the second A/D converter 13 and synchronously detects the signal at the same frequency as the AC signal in the signal application unit 6, and extracts the signal. Then, the second synchronous detection circuit 14 outputs the extracted signal to the control unit 9. The output signal of the second synchronous detection circuit 14 is a signal corresponding to the terminal voltage of the correction resistor 5. In this way, during the correction period, the second voltage detection unit 8 is configured to detect the terminal voltage of the correction resistor 5 based on the output signal of the second synchronous detection circuit 14, and outputs the signal representing the detection value of the terminal voltage as the second voltage detection value to the control unit 9.

As described above, in the present embodiment, the first voltage detection unit 7 and the second voltage detection unit 8 detect the terminal voltages of the shunt resistor 4 and the correction resistor 5 when an alternating current signal is applied to the series circuit of the shunt resistor 4 and the correction resistor 5, and function as the voltage detection unit 20. In this case, the first A/D converter 11 and the first synchronous detection circuit 12 constituting the first voltage detection unit 7, and the second A/D converter 13 and the second synchronous detection circuit 14 constituting the second voltage detection unit 8 are adapted to operate by receiving the power supply of the second power supply P2 generated by the power supply circuit 10.

The control unit 9 is configured as a semiconductor integrated circuit such as the same ASIC together with the voltage detection unit 20. ASIC is an abbreviation for Application Specific Integrated Circuit. The control unit 9 includes functional blocks such as a current detection unit 15 and a correction unit 16. Each of these functional blocks is realized by hardware. The control unit 9 may be configured as a semiconductor integrated circuit separated from the voltage detection unit 20. For example, the control unit 9 may be configured by a microcomputer including a CPU, a RAM, a ROM, and the like. In this case, each of the above-mentioned functional blocks is realized by the CPU of the control unit 9 executing a computer program stored in a ROM or the like to provide a process corresponding to the computer program, that is, realized by software. Alternatively, in this case, at least a part of the functional blocks of the parking lot server device may be implemented in hardware manner.

The current detection unit 15 detect a detection target current using a signal corresponding to the terminal voltage of the shunt resistor 4 output from the first voltage detection unit 7 at the normal time and a resistance value for detection corresponding to the resistance value of the shunt resistor 4. The resistance value for detection is set based on the initial resistance value of the shunt resistor 4 actually used, and is stored in advance in the memory provided in the control unit 9. Here, since the detection target current, which is a relatively large current, flows in the shunt resistor 4, the resistance value changes from the initial value due to deterioration over time or the like.

Therefore, the above-mentioned resistance value for detection is corrected at any time by the operation of the correction unit 16. At the time of correction, the correction unit 16 calculates the resistance value of the shunt resistor 4 based on the corrected resistance value corresponding to the resistance value of the correction resistor 5, the signal representing a first voltage detection value output from the first voltage detection unit 7, and the signal representing a second voltage detection value output from the second voltage detection unit 8. The correction unit 16 corrects the resistance value for detection based on the calculated resistance value which is the calculated resistance value of the shunt resistor 4. For example, the correction unit 16 can correct the resistance value for detection so as to match the calculated resistance value.

The above-mentioned correction resistance value is an initial resistance value of the correction resistor 5 actually used, and is stored in advance in the memory provided in the control unit 9. Since the detection target current does not flow in the correction resistor 5 in the normal state, the resistance value hardly changes from the initial value due to aged deterioration or the like. As described above, in the above configuration, the resistance value correction circuit 17 for correcting the resistance value for detection is configured by the correction resistor 5, the signal application unit 6, the first voltage detection unit 7, the second voltage detection unit 8, and the correction unit 16.

The power supply circuit 10 supplies power to the resistance value correction circuit 17, and includes a first power supply generation unit 18 and a second power supply generation unit 19. The first power supply generation unit 18 generates a first power supply P1 having a low voltage with respect to the input power supply Pin by stepping down the input power supply Pin supplied from the outside. The second power supply generation unit 19 uses the input power supply Pin to generate a second power supply P2 different from the first power supply P1. The power supply circuit 10 supplies the first power supply P1 and the second power supply P2 to the resistance value correction circuit 17. Specifically, the power supply circuit 10 supplies the first power supply P1 to the signal application unit 6 and supplies the second power supply P2 to the first voltage detection unit 7 and the second voltage detection unit 8 which function as the voltage detection unit 20.

Figure 2:
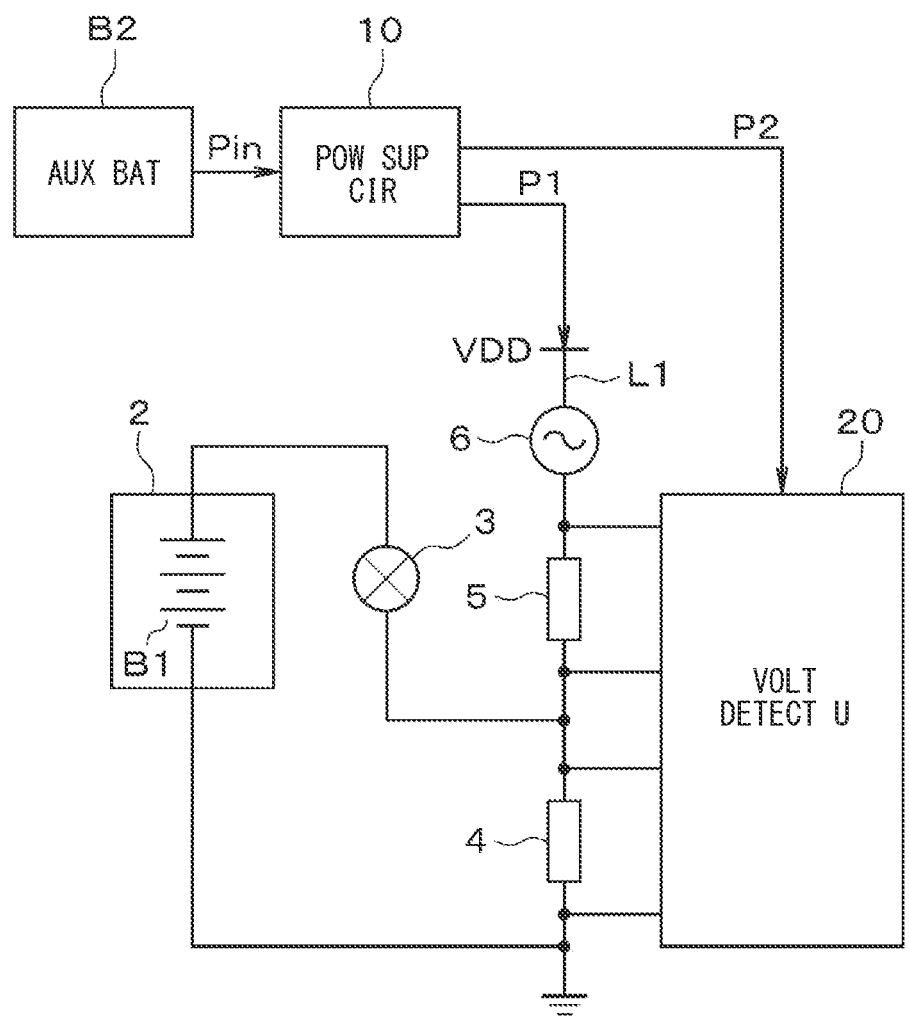
FIG. 2 is a diagram for explaining a first supply method of input power to the power supply circuit according to the first embodiment.
Figure 3:
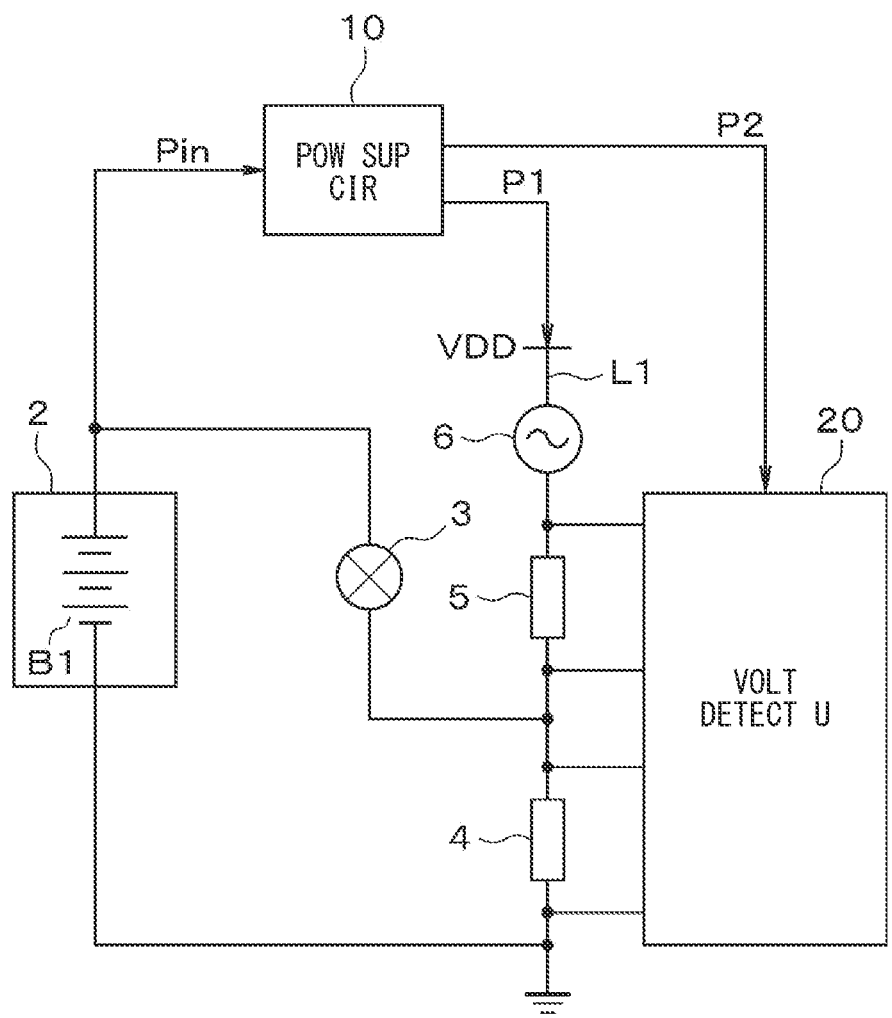
FIG. 3 is a diagram for explaining a second supply method of input power to the power supply circuit according to the first embodiment.

In the above configuration, the following two methods are specifically assumed as the power supply method of the input power supply Pin to the power supply circuit 10. In the following description, it is assumed that the measurement target 2 is the main battery B1, which is a high-voltage battery of about several hundred volts that supplies electric power to the drive unit for driving the vehicle. As shown in FIG. 2, in the first supply method, the input power supply Pin is supplied from the auxiliary battery B2, which is a low voltage battery of, for example, about 12 V that supplies electric power to the auxiliary device of the vehicle. Further, as shown in FIG. 3, in the second supply method, the input power supply Pin is supplied from the main battery B1.

<Specific Configuration of Signal Application Unit>

Figure 4:
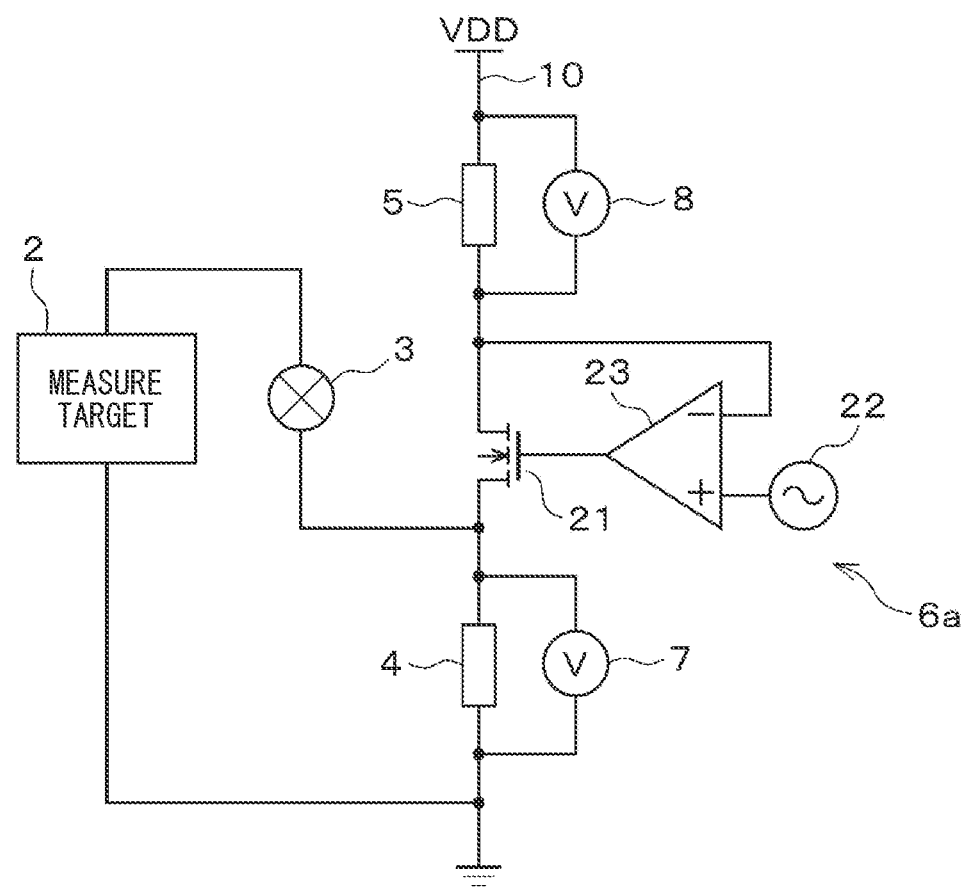
FIG. 4 is a diagram showing a specific first configuration example of the signal application unit according to the first embodiment.
Figure 5:
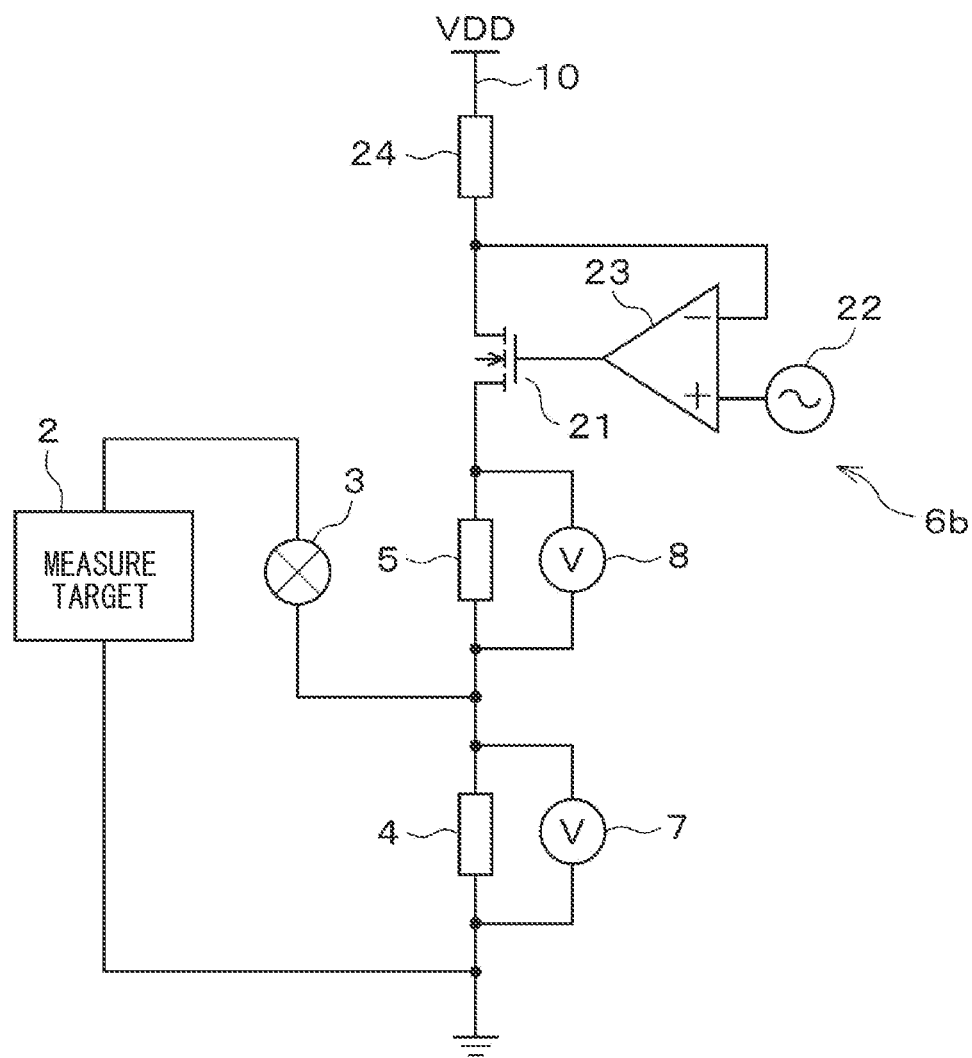
FIG. 5 is a diagram showing a specific second configuration example of the signal application unit according to the first embodiment.
Figure 6:
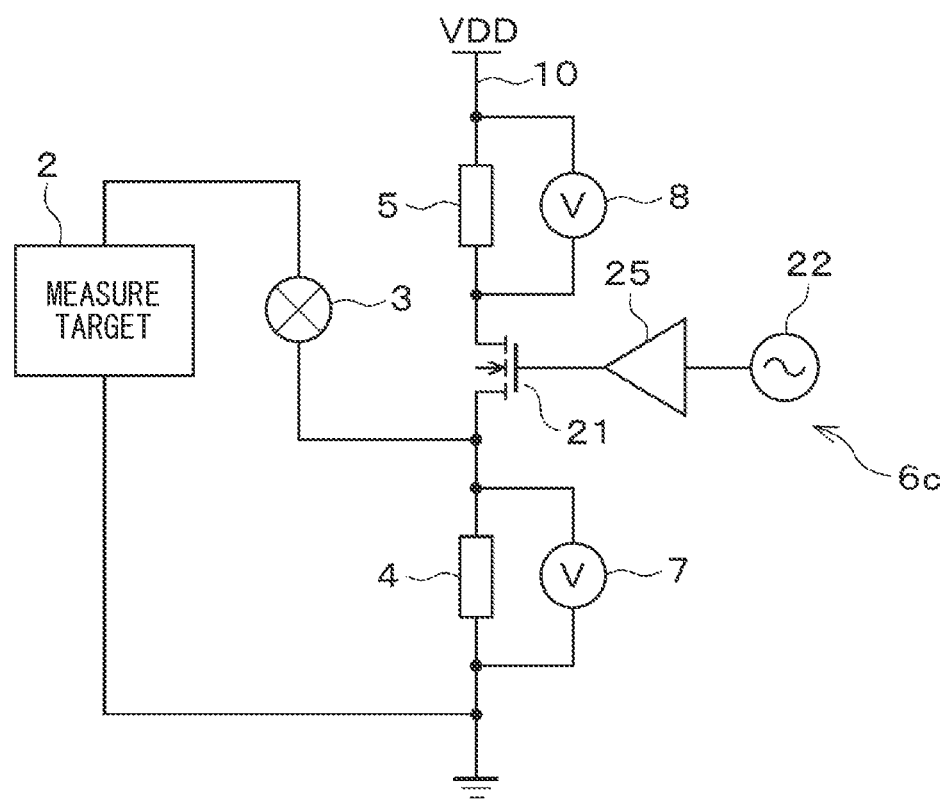
FIG. 6 is a diagram showing a specific third configuration example of the signal application unit according to the first embodiment.
Figure 7:
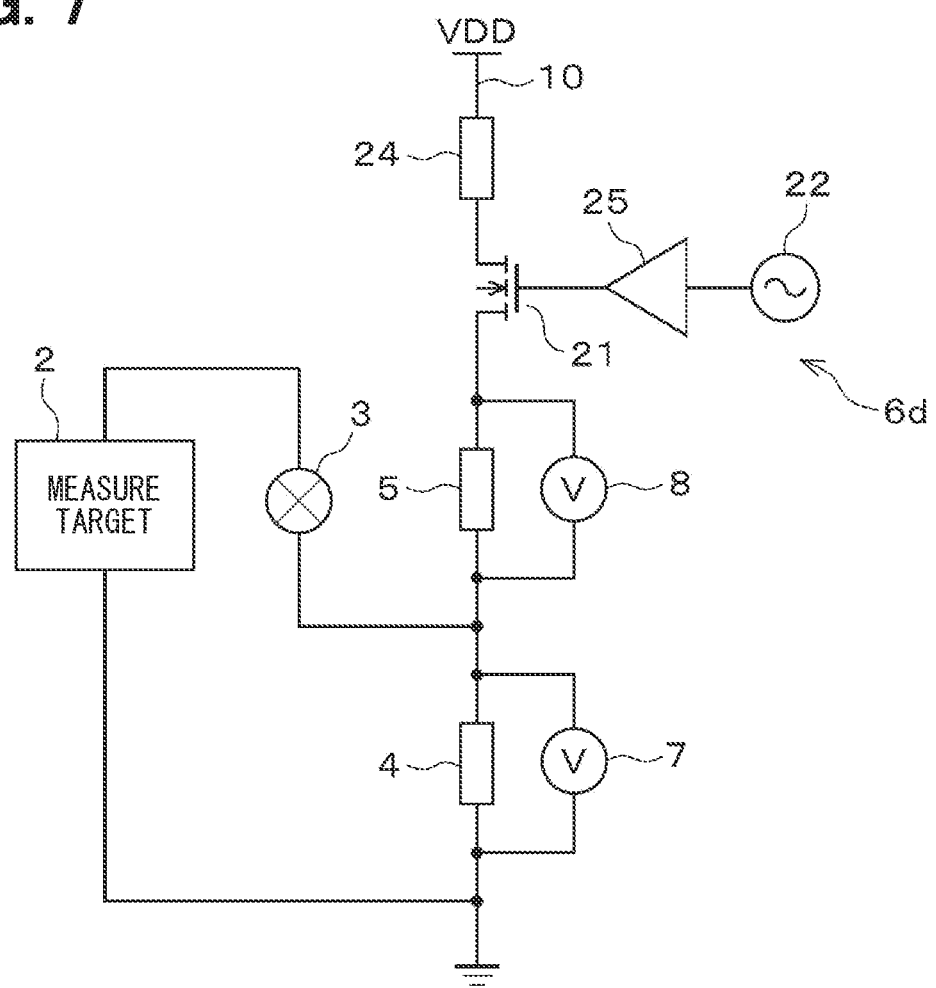
FIG. 7 is a diagram showing a specific fourth configuration example of the signal application unit according to the first embodiment.

Specific configurations of the signal application unit 6 include, for example, a first configuration example shown in FIG. 4, a second configuration example shown in FIG. 5, a third configuration example shown in FIG. 6, a fourth configuration example shown in FIG. 7, and the like.

[1] First Configuration Example

As shown in FIG. 4, the signal application unit 6a of the first configuration example includes a transistor 21, a signal generation unit 22, an OP amplifier 23, and the like. The transistor 21 is, for example, an N-channel MOSFET whose drain is connected to the power supply line L1 via a correction resistor 5 and source is connected to ground via a shunt resistor 4. The signal generation unit 22 generates and outputs a pulse wave signal or a sine wave signal having the same frequency as the alternating current applied to the series circuit of the shunt resistor 4 and the correction resistor 5.

The output signal of the signal generation unit 22 is given to the non-inverting input terminal of the OP amplifier 23. The inverting input terminal of the OP amplifier 23 is connected to the drain of the transistor 21, and its output terminal is connected to the gate of the transistor 21. According to the above configuration, the transistor 21 is driven by the OP amplifier 23, so that an AC signal, which is an alternating current, is applied to the series circuit of the shunt resistor 4 and the correction resistor 5. As described above, the signal application unit 6a of the first configuration example is configured to be driven by an amplifier. In this case, the correction resistor 5 also functions as a current source for the signal application unit 6a.

[2] Second Configuration Example

As shown in FIG. 5, the signal application unit 6b of the second configuration example is different from the signal application unit 6a of the first configuration example shown in FIG. 4 in that a resistor 24 is added. In this case, the drain of the transistor 21 is connected to the power line L1 via the resistor 24, and its source is connected to the ground via the correction resistor 5 and the shunt resistor 4.

Even with the above configuration, as in the first configuration example, the transistor 21 is driven by the OP amplifier 23, so that an AC signal, which is an alternating current, is applied to the series circuit of the shunt resistor 4 and the correction resistor 5. As described above, the signal application unit 6b of the second configuration example has an amplifier drive configuration like the signal application unit 6a of the first configuration example. In this case, the resistor 24 and the transistor 21 provided separately from the correction resistor 5 function as a current source of the signal application unit 6b.

[3] Third Configuration Example

As shown in FIG. 6, the signal application unit 6c of the third configuration example is different from the signal application unit 6a of the first configuration example shown in FIG. 4 in that a buffer 25 instead of the OP amplifier 23 is arranged. In this case, the output signal of the signal generation unit 22 is given to the input terminal of the buffer 25. The output terminal of the buffer 25 is connected to the gate of the transistor 21. According to the above configuration, the transistor 21 is driven by the buffer 25, so that an AC signal, which is an alternating current, is applied to the series circuit of the shunt resistor 4 and the correction resistor 5. As described above, the signal application unit 6c of the third configuration example has a buffer drive configuration.

[4] Fourth Configuration Example

As shown in FIG. 7, the signal application unit 6d of the fourth configuration example is different from the signal application unit 6b of the second configuration example shown in FIG. 5 in that a buffer 25 instead of the OP amplifier 23 is arranged. In this case, the output signal of the signal generation unit 22 is given to the input terminal of the buffer 25. The output terminal of the buffer 25 is connected to the gate of the transistor 21. According to the above configuration, the transistor 21 is driven by the buffer 25, so that an AC signal, which is an alternating current, is applied to the series circuit of the shunt resistor 4 and the correction resistor 5. As described above, the signal application unit 6d of the fourth configuration example has a buffer drive configuration.

[5] Features of Each Configuration Example

In the first configuration example and the third configuration example, since the correction resistor 5 is arranged close to the power supply line L1, and the shunt resistance 4 is arranged close to the ground, the first voltage detection unit 7 and the second voltage detection unit 7 detect voltages at potentials that are significantly different from each other. Therefore, according to the first configuration example and the third configuration example, although the detection errors of the terminal voltages of the shunt resistor 4 and the correction resistor 5 may be likely to occur with respect to the second configuration example and the fourth configuration example, the correction resistance 5 provides current sources for the application units 6a and 6c in common so that the number of elements can be suppressed to a small number as an advantage.

In the second configuration example and the fourth configuration example, since it is necessary to provide a resistor 24 different from the correction resistor 5 in order to configure the current source of the signal application units 6b and 6d, as a disadvantage, the number of elements increases compared with the first configuration example and the third configuration example. However, in the second configuration example and the fourth configuration example, since both the correction resistor 5 and the shunt resistor 4 are arranged close to the ground, the first voltage detection unit 7 and the second voltage detection unit 8 detect voltages at potentials similar to each other. Therefore, according to the second configuration example and the fourth configuration example, there is an advantage that the detection errors of the terminal voltages of the shunt resistor 4 and the correction resistor 5 can be suppressed to be smaller than those of the first configuration example and the third configuration example.

According to the first configuration example and the second configuration example of the amplifier drive configuration, the drain voltage of the transistor 21 is controlled to be constant by the operation of the OP amplifier 23, so that the first configuration example and the second configuration example have a merit, compared with the third configuration example and the fourth configuration example of the buffer drive configuration, such that the accuracy of the AC current applied to the series circuit of the shunt resistor 4 and the correction resistor 5 can be improved. On the other hand, according to the third configuration example and the fourth configuration example, there is an advantage that the circuit scale can be suppressed to a smaller size by using the buffer 25 instead of the OP amplifier 23 as compared with the first configuration example and the second configuration example.

<Specific Configuration of Each Synchronous Detection Circuit>

Figure 8:
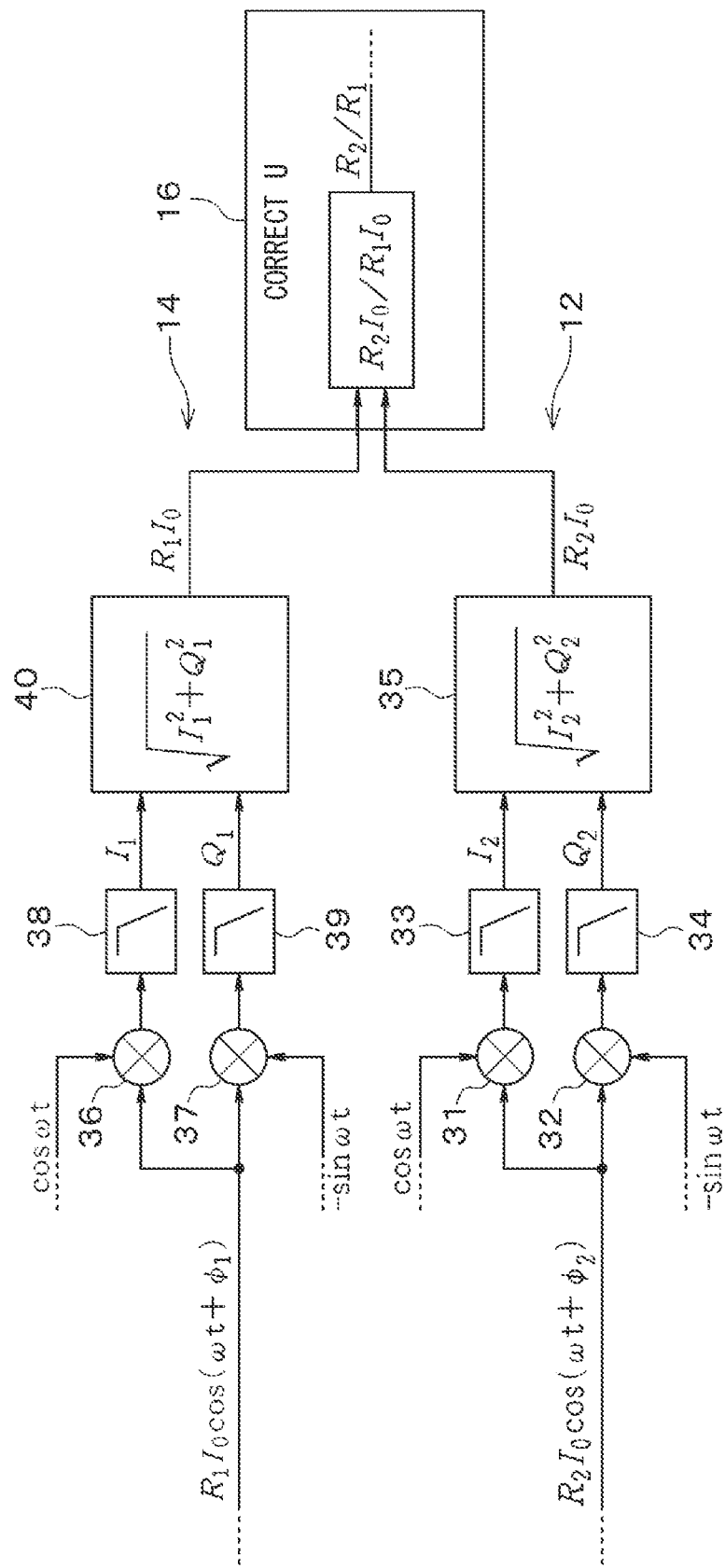
FIG. 8 is a specific configuration example of each synchronous detection circuit according to the first embodiment.

A specific configuration of the first synchronous detection circuit 12 and the second synchronous detection circuit 14 includes, for example, the configuration shown in FIG. 8. In this case, the alternating current signal, which is the AC current applied to the series circuit of the shunt resistor 4 and the correction resistor 5 by the signal application unit 6, is defined as "Io×cos (ωt)", and the resistance value of the shunt resistor 4 is defined as R2, and the resistance value of the correction resistor 5 is defined as R1. Here, w is an angular frequency and t is a time.

As shown in FIG. 8, the first synchronous detection circuit 12 includes multipliers 31 and 32, low-pass filters 33 and 34, and an arithmetic unit 35. In this specification, the low-pass filter may be abbreviated as LPF. During the time of correction when the AC signal is applied to the series circuit of the shunt resistor 4 and the correction resistor 5, the digital signal output from the first A/D converter 11 is input into each one input terminal of the multipliers 31 and 32 of the first synchronous detection circuit 12. This digital signal is a signal corresponding to the terminal voltage of the shunt resistor 4 in the time of correction, and is defined as "R2×Io×cos (ωt+φ2)".

A cosine wave signal of "cos (ωt)" is input to the other input terminal of the multiplier 31. A sine wave signal of "−sin (ωt)" is input to the other input terminal of the multiplier 32. As a result, in each output signal of the multipliers 31 and 32, the signal having the angular frequency ω is extracted as a direct current component. The output signals of the multipliers 31 and 32 are input to the LPFs 33 and 34, respectively.

The output signal I2 of the LPF 33 is a low frequency signal proportional to the in-phase component of the input signal, and the output signal Q2 of the LPF 34 is a low frequency signal proportional to the orthogonal phase component of the input signal. The arithmetic unit 35 calculates the square root of the sum of squares of the signal I2 and the signal Q2, and outputs a signal representing the calculation result. The output signal of the arithmetic unit 35 is expressed as "R2×Io". The output signal of the arithmetic unit 35 becomes an output signal of the first synchronous detection circuit 12, and is given to the correction unit 16 of the control unit 9.

The second synchronous detection circuit 14 includes multipliers 36 and 37, low-pass filters 38 and 39, and an arithmetic unit 40. During the time of correction when the AC signal is applied to the series circuit of the shunt resistor 4 and the correction resistor 5, the digital signal output from the second A/D converter 13 is input into each one input terminal of the multipliers 36 and 37 of the second synchronous detection circuit 14. This digital signal is a signal corresponding to the terminal voltage of the correction resistor 5 in the time of correction, and is defined as "R1×Io×cos (ωt+ φ1)".

A cosine wave signal of "cos (ωt)" is input to the other input terminal of the multiplier 36. A sine wave signal of "−sin(ωt)" is input to the other input terminal of the multiplier 37. As a result, in each output signal of the multipliers 36 and 37, the signal having the angular frequency ω is extracted as a direct current component. The output signals of the multipliers 36 and 37 are input to the LPFs 38 and 39, respectively.

The output signal I1 of the LPF 38 is a low frequency signal proportional to the in-phase component of the input signal, and the output signal Q1 of the LPF 39 is a low frequency signal proportional to the orthogonal phase component of the input signal. The arithmetic unit 40 calculates the square root of the sum of squares of the signal I1 and the signal Q1, and outputs a signal representing the calculation result. The output signal of the arithmetic unit 40 is expressed as "R1×Io". The output signal of the arithmetic unit 40 becomes an output signal of the second synchronous detection circuit 14, and is given to the correction unit 16 of the control unit 9.

The correction unit 16 obtains the value "R2/R1" by dividing the output signal "R2/Io" of the first synchronous detection circuit 12 by the output signal "R1/Io" of the second synchronous detection circuit 14. Here, the resistance value R1 of the correction resistor 5 is a known value and is stored in advance in the memory of the control unit 9 or the like. Therefore, the correction unit 16 multiplies the value "R2/R1" obtained as described above by the resistance value R1 stored in advance, so that the resistance value R2 of the shunt resistance 4 at the present time, that is, the calculation resistance value can be calculated.

<Specific Configuration of Power Supply Circuit>

Figure 9:
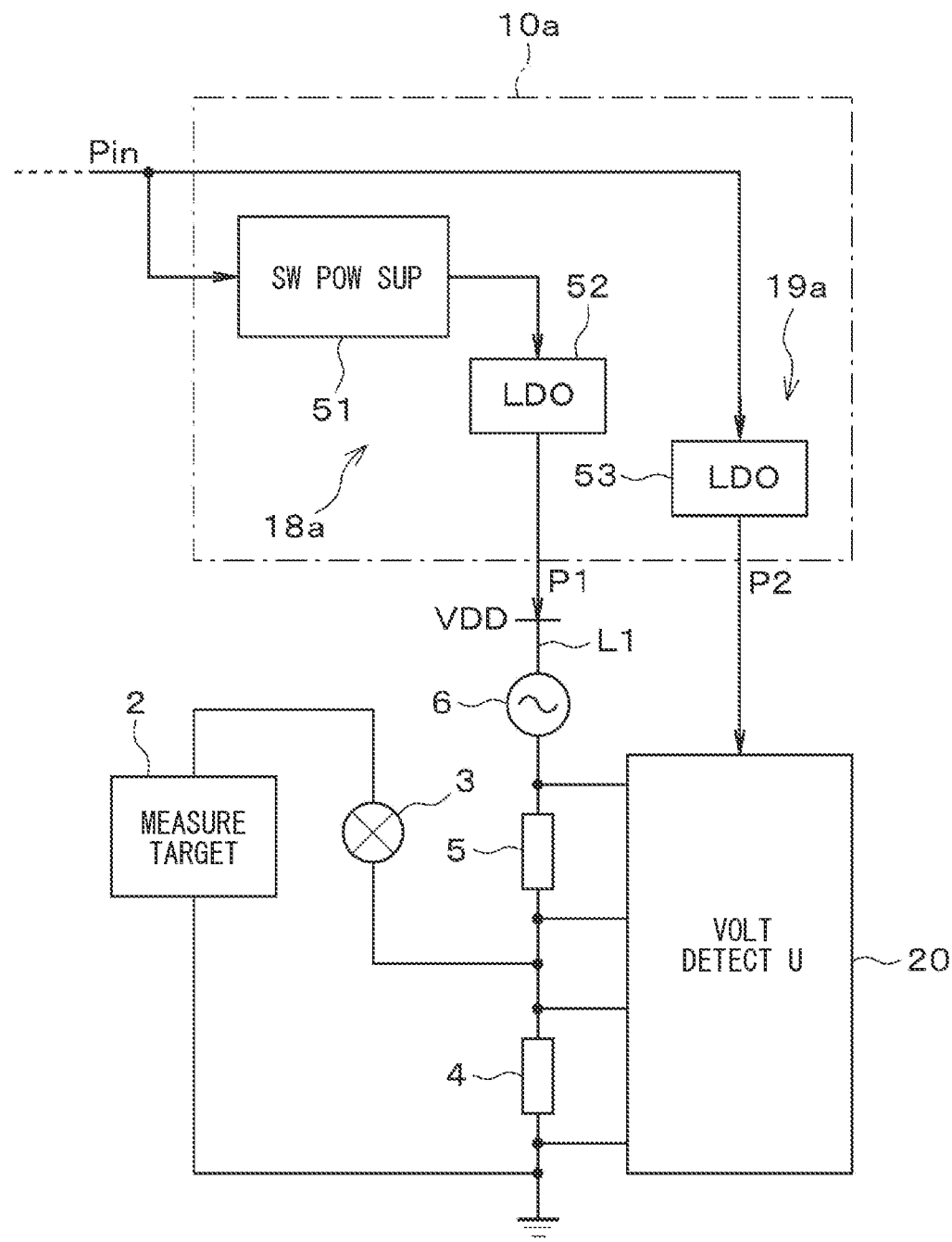
FIG. 9 is a diagram showing a specific first configuration example of the power supply circuit according to the first embodiment.
Figure 10:
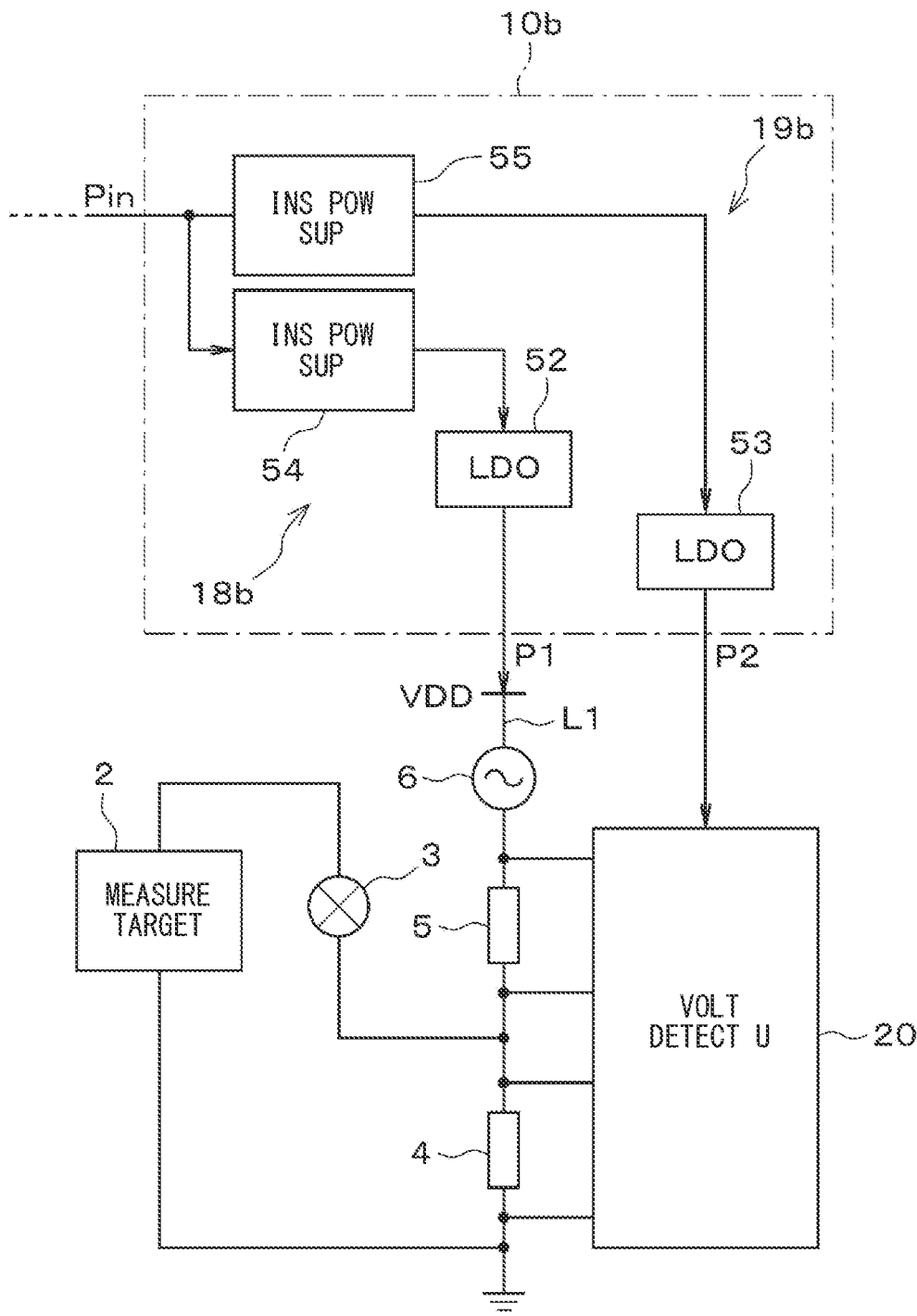
FIG. 10 is a diagram showing a specific second configuration example of the power supply circuit according to the first embodiment.
Figure 11:
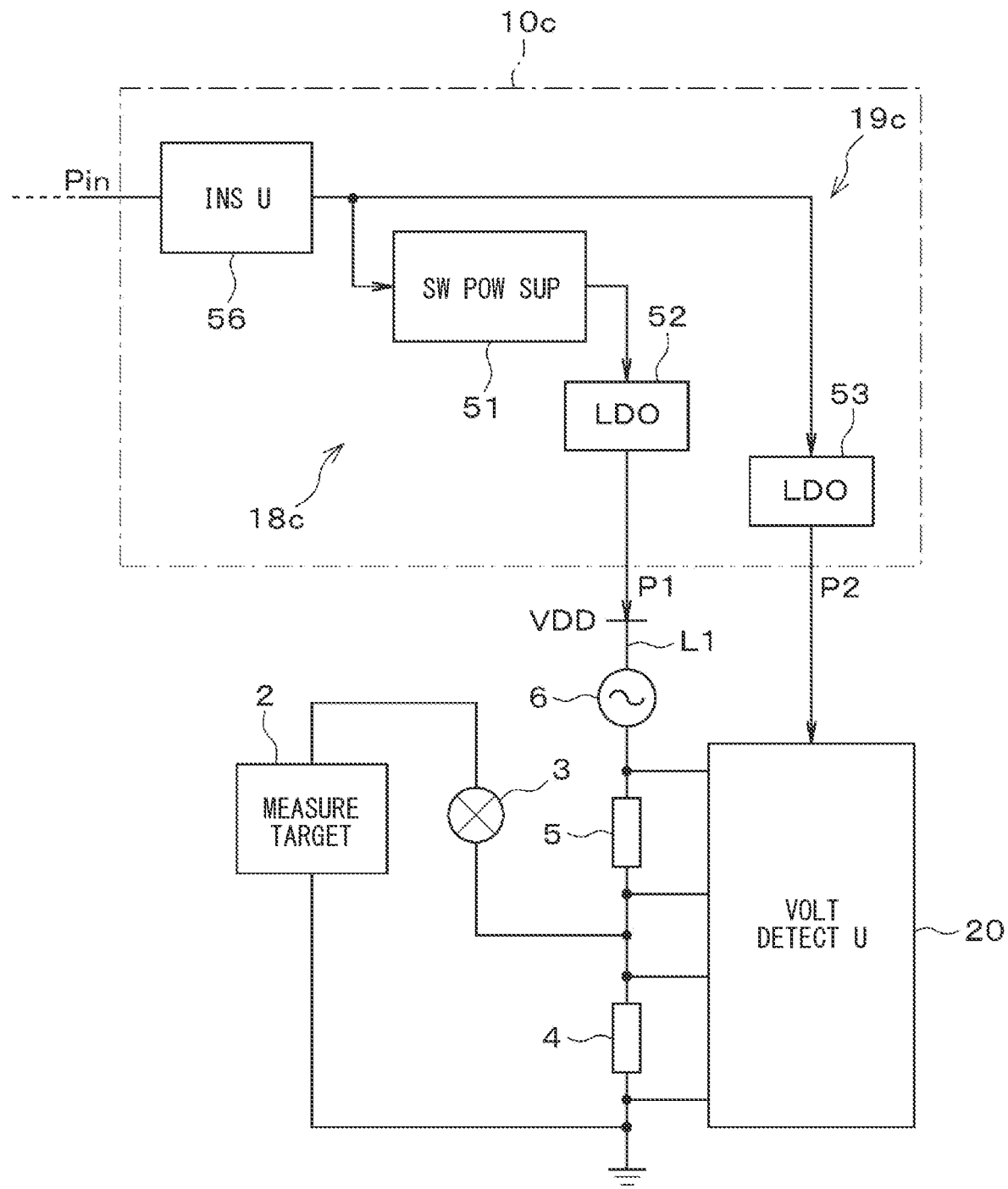
FIG. 11 is a diagram showing a specific third configuration example of the power supply circuit according to the first embodiment.

Specific examples of the power supply circuit 10 include, for example, a first configuration example shown in FIG. 9, a second configuration example shown in FIG. 10, a third configuration example shown in FIG. 11, and the like.

[1] First Configuration Example

As shown in FIG. 9, the first power supply generation unit 18a of the power supply circuit 10a of the first configuration example includes a non-isolated switching power source 51 in which the input side and the output side are not isolated from each other, and a low dropout linear regulator 52. In the present specification and drawings such as FIG. 9, the low dropout linear regulator may be abbreviated as LDO.

The switching power source 51 functions as a step-down converter, inputs an input power supply Pin, and generates and outputs a power supply prepared by stepping down the input power supply Pin. The LDO 52 inputs a power supply output from the switching power source 51, steps down the power supply, and generates and outputs a stabilized power supply. In the above configuration, the electric power output from the LDO 52 corresponds to the first power supply P1 and is supplied to the signal application unit 6. As described above, the first power supply generation unit 18a includes the LDO 52, and generates the first power supply P1 whose voltage value is stabilized by the LDO 52.

The second power supply generation unit 19a of the power supply circuit 10a is configured to include the LDO 53. The LDO 53 inputs an input power supply Pin, steps down the input power supply Pin, and generates and outputs a stabilized power supply. In the above configuration, the power supply output from the LDO 53 corresponds to the second power supply P2, and is supplied to the voltage detection unit 20, that is, the first voltage detection unit 7 and the second voltage detection unit 8. As described above, the second power supply generation unit 19a includes the LDO 53, and generates the second power supply P2 whose voltage value is stabilized by the LDO 53.

[2] Second Configuration Example

As shown in FIG. 10, the first power supply generation unit 18b of the power supply circuit 10b of the second configuration example is different from the first power supply generation unit 18a of the first configuration example shown in FIG. 9 in that the insulation power source 54 instead of the switching power source 51 is equipped. The insulation power source 54 has a configuration including an insulation element such as a transformer, and is an insulation type switching power source in which the input side and the output side are insulated from each other. The insulation power source 54 functions as a step-down converter, inputs an input power supply Pin, and generates and outputs a power supply prepared by stepping down the input power supply Pin. In this case, the LDO 52 inputs the power output from the isolation power source 54, steps down the power source, and generates and outputs the first power source P1 which is a stabilized power source.

The second power supply generation unit 19b of the power supply circuit 10b is different from the second power supply generation unit 19a of the first configuration example shown in FIG. 9 in that an insulation power source 55 is added. The insulation power source 55 has a configuration including an insulation element such as a transformer, and is an insulation type switching power source in which the input side and the output side are insulated from each other. The insulation power source 55 functions as a step-down converter, inputs an input power supply Pin, and generates and outputs a power supply prepared by stepping down the input power supply Pin. In this case, the LDO 53 inputs the power output from the isolation power source 55, steps down the power source, and generates and outputs the second power source P2 which is a stabilized power source.

[3] Third Configuration Example

As shown in FIG. 11, the first power supply generation unit 18c of the power supply circuit 10c of the third configuration example is different from the first power supply generation unit 18a of the first configuration example shown in FIG. 9 in that the insulation unit 56 having an insulation element such as a transformer is added. In this case, the switching power source 51 inputs the input power supply Pin via the insulation unit 56, and generates and outputs a power supply by stepping down the input power supply Pin.

The second power supply generation unit 19c of the power supply circuit 10c is different from the second power supply generation unit 19a of the first configuration example shown in FIG. 9 in that an insulation unit 56 is added. The insulation unit 56 is shared by both the first power generation unit 18c and the second power generation unit 19c. Therefore, the insulation unit 56 needs to have a larger capacity than the transformer provided in the insulation power sources 54 and 55 of the second configuration example. In this case, the LDO 53 inputs the input power supply Pin via the insulation unit 56, steps down the input power supply Pin, and generates and outputs the second power supply P2 which is a stabilized power supply.

[4] Features of Each Configuration Example

Although the first configuration example is applied only to a system that does not require insulation in the power supply circuit 10, the first configuration example has an advantage such that the size of the configuration is kept small since the configuration does not include a transformer, which is a relatively large component with respect to the second configuration example and the third configuration example. On the other hand, the second configuration example and the third configuration example have the advantage such that the configurations are applied to a system that requires insulation in the power supply circuit 10, although the configurations are larger by the size including the transformer than the first configuration example.

The above-described embodiment provides the following effect.

A current sensor 1 according to the present embodiment detects a detection target current using a terminal voltage of a shunt resistor 4 provided in series in a path through which the detection target current flows and a resistance value for current detection corresponding to the resistance value of the shunt resistor 4. The current sensor 1 includes: a resistance value correction circuit 17 for correcting the resistance value for detection and a power supply circuit 10 for supplying power to the resistance value correction circuit 17. The resistance value correction circuit 17 includes a correction resistor 5, a signal application unit 6, a first voltage detection unit 7, a second voltage detection unit 8, and a correction unit 16. The correction resistor 5 is connected in series together with the shunt resistor 4 in a path different from the path through which the detection target current flows, and the resistance accuracy thereof is higher than that of the shunt resistor 4.

The signal application unit 6 applies an AC signal to the series circuit of the shunt resistor 4 and the correction resistor 5. The first voltage detection unit 7 detects the terminal voltage of the shunt resistor 4 when the AC signal is applied to the series circuit. The second voltage detection unit 8 detects the terminal voltage of the correction resistor 5 when the AC signal is applied to the series circuit. The correction unit 16 calculates the resistance value of the shunt resistor 4 based on the first voltage detection value which is the terminal voltage detection value by the first voltage detection unit 7 and the second voltage detection value which is the terminal voltage detection value by the second voltage detection unit 8, and corrects the detection resistance value based on the calculated resistance value which is the calculated resistance value of the shunt resistor 4.

According to the resistance value correction circuit 17 having such a configuration, the resistance value for detection is directly corrected by using the shunt resistor 4 without indirectly correcting the resistance value for detection by using the sub-resistance as in the first conceivable technique. As a result, the accuracy of correction of the resistance value for detection is improved. Further, according to the above configuration, unlike the second conceivable technique, it is not necessary to provide a plurality of shunt resistors nor to provide an input terminal at the center of the shunt resistors, and only one shunt resistor 4 needs to be provided, so that the configuration of the entire current sensor 1 is not complicated. Further, according to the above configuration, the calculation accuracy of the calculated resistance value and the correction accuracy of the detection resistance value greatly depend on the accuracy of the resistance value of the correction resistor 5 and the detection accuracy of the first voltage detection value and the second voltage detection value. In this case, since the correction resistor 5 has a higher resistance accuracy than the shunt resistor 4, the correction accuracy of the detection resistance value is sufficiently improved.

In the above configuration, as the shunt resistor 4 and the correction resistor 5, since the power consumption cannot be increased unnecessarily, those resistors having a relatively small resistance value may be used. Therefore, in the above configuration, in order to improve the detection accuracy of each terminal voltage by the first voltage detection unit 7 and the second voltage detection unit 8, and eventually to improve the correction accuracy of the resistance value for detection, it is necessary to increase the level of the AC signal applied to the series circuit of the shunt resistance 4 and the correction resistance 5, that is, to increase the output current of the signal application unit 6.

In order to increase the output current of the signal application unit 6, it is necessary to flow a sufficiently large current using the power supply circuit 10. When a configuration for flowing a large current simply is adopted in the power supply circuit 10, the power consumption may increase significantly. Therefore, the power supply circuit 10 of the present embodiment includes: a first power supply generation unit 18 that generates a first power supply P1 having a low voltage with respect to the input power supply Pin by stepping down the input power supply Pin supplied from the outside; and a second power supply generation unit 19 that generates a second power supply P2 different from the first power supply P1. The power supply circuit 10 supplies the first power supply P1 to the signal application unit 6, and supplies the second power supply P2 to the first voltage detection unit 7 and the second voltage detection unit 8 which function as a voltage detection unit 20.

As described above, in the configuration of the present embodiment, since the signal application unit 6 operates by receiving the supply of the first power supply P1 generated by stepping down the input power supply Pin, the power supply voltage VDD is set to a low voltage, for example, about +1V. On the other hand, it is possible to set the output current to be a large current of, for example, about 1 A, that is, to increase the level of the AC signal applied to the series circuit of the shunt resistor 4 and the correction resistor 5. Therefore, according to the above embodiment, it is possible to obtain an excellent effect that the resistance value for detection can be corrected with high accuracy and the power consumption can be suppressed to a low level without complicating the configuration of the entire current sensor 1.

According to the configuration of the present embodiment as described above, there are the following merits as compared with the comparative example in which the input power supply Pin itself is supplied to the signal application unit 6, for example. That is, assuming that the power supplied from the supply source of the input power supply Pin to the signal application unit 6 is equal in each of the configuration of the present embodiment and the configuration of the comparative example, in the configuration of the comparative example, it is necessary to increase the current to be output from the supply source of the input power supply Pin in order to increase the current to be supplied to the signal application unit 6. Thus, a high voltage and a large current may occur in this portion, and a large amount of heat may be generated. On the other hand, in the configuration of the present embodiment, the current supplied from the supply source of the input power supply Pin to the power supply circuit 10 is restricted to be small, and the current supplied from the power supply circuit 10 to the signal application unit 6 is set to be a large current. Thus, in the present embodiment, it is possible to suppress the heat generation to a small value and the power consumption to a low level as compared with the configuration of the comparative example.

The first power supply generation unit 18 may be configured to include a switching power source 51 or an insulation power source 54 which is an insulation type switching power supply. In general, the switching power source can be more efficient than a linear regulator. Therefore, according to such a configuration, the power loss in the configuration for generating the first power supply P1 is restricted to be smaller than the configuration in which the first power supply P1 is generated by using only the linear regulator or the like without using the switching power source. As a result, the power consumption of the current sensor 1 as a whole can be further reduced.

The first power supply generation unit 18 includes the LDO 52, and generates the first power supply P1 whose voltage value is stabilized by the LDO 52. According to such a configuration, even if noise is superimposed on the input power supply Pin, the switching power source 51, the power supply output from the insulation power source 54, or the like, the first power supply P1 is a power supply having reduced noise. Therefore, according to the above configuration, the influence of noise is prevented from being affected on the operation of the signal application unit 6 to which the first power supply P1 is supplied, specifically, on the accuracy of the AC signal applied to the series circuit of the shunt resistor 4 and the correction resistor 5. As a result, the accuracy of correction of the resistance value for detection can be well maintained.

The second power supply generation unit 19 includes the LDO 53, and generates the second power supply P2 whose voltage value is stabilized by the LDO 53. According to such a configuration, even if noise is superimposed on the input power supply Pin, the power supply output from the insulation power source 55, and the like, the second power supply P2 is a power supply with reduced noise. Therefore, according to the above configuration, it is possible to prevent the influence of noise on the operation of the first voltage detection unit 7 and the second voltage detection unit 8 to which the second power supply P2 is supplied, specifically, on the detection accuracy of each terminal voltage of the shunt resistor 4 and the correction resistor 5. As a result, the accuracy of correction of the resistance value for detection can be well maintained.

Second Embodiment

The second embodiment of the present disclosure is described with reference to FIGS. 12 to 14.

(General Configuration)

Figure 12:
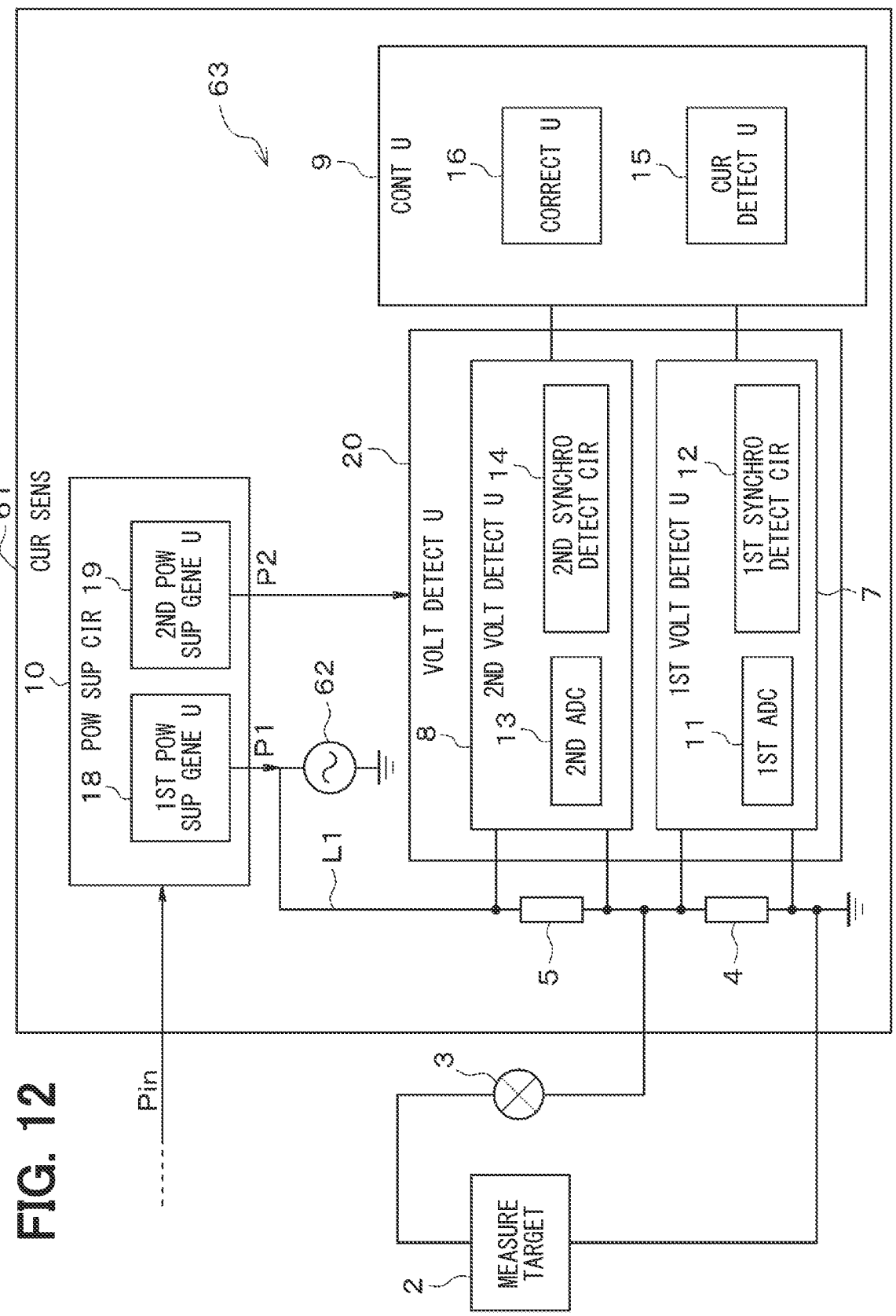
FIG. 12 is a diagram schematically showing a configuration of a current sensor according to a second embodiment.

As shown in FIG. 12, the current sensor 61 of the present embodiment is different from the current sensor 1 of the first embodiment shown in FIG. 1 in that the signal application unit 62 instead of the signal application unit 6 is arranged.

Similar to the signal application unit 6, the signal application unit 62 applies a pulse wave signal or a sine wave AC signal to the series circuit of the shunt resistor 4 and the correction resistor 5 at the time of correction. In this case, the signal application unit 62 is configured as a voltage source for supplying an AC voltage to the series circuit of the shunt resistor 4 and the correction resistor 5. As described above, in the above configuration, the resistance value correction circuit 63 for correcting the resistance value for detection is configured by the correction resistor 5, the signal application unit 62, the first voltage detection unit 7, the second voltage detection unit 8, and the correction unit 16. In this case, the power supply circuit 10 supplies the first power supply P1 and the second power supply P2 to the resistance value correction circuit 63. Specifically, the power supply circuit 10 supplies the first power supply P1 to the signal application unit 62 and supplies the second power supply P2 to the first voltage detection unit 7 and the second voltage detection unit 8 which function as the voltage detection unit 20.

<Specific Configuration of Signal Application Unit>

Figure 13:
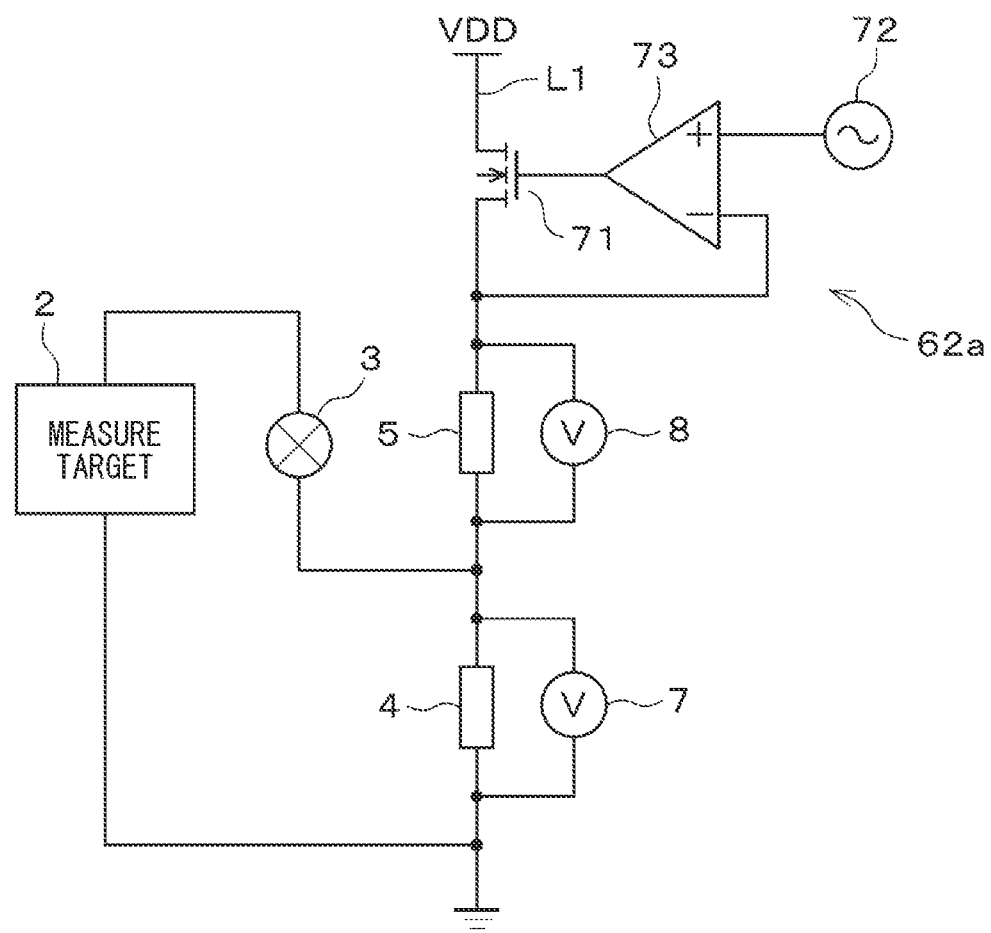
FIG. 13 is a diagram showing a specific first configuration example of the signal application unit according to the second embodiment.
Figure 14:
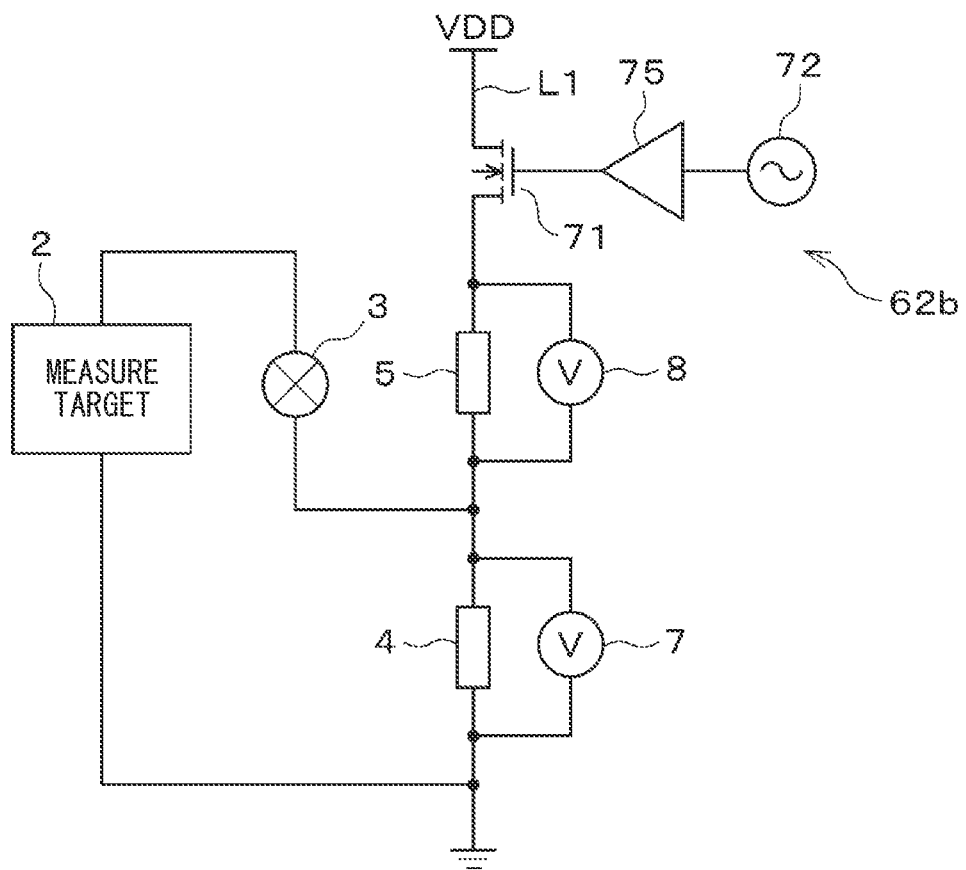
FIG. 14 is a diagram showing a specific second configuration example of the signal application unit according to the second embodiment.

Specific examples of the signal application unit 62 include a first configuration example shown in FIG. 13, a second configuration example shown in FIG. 14, and the like.

[1] First Configuration Example

As shown in FIG. 13, the signal application unit 62a of the first configuration example includes a transistor 71, a signal generation unit 72, an OP amplifier 73, and the like. The transistor 71 is, for example, an N-channel MOSFET whose drain is connected to the power supply line L1 and source is connected to ground via the correction resistor 5 and the shunt resistor 4.

The signal generation unit 72 generates and outputs a pulse wave signal or a sine wave signal having the same frequency as the alternating current voltage applied to the series circuit of the shunt resistor 4 and the correction resistor 5. The output signal of the signal generation unit 72 is given to the non-inverting input terminal of the OP amplifier 73. The inverting input terminal of the OP amplifier 73 is connected to the source of the transistor 71, and its output terminal is connected to the gate of the transistor 71. According to the above configuration, the transistor 71 is driven by the OP amplifier 73, so that an AC signal, which is an alternating current voltage, is applied to the series circuit of the shunt resistor 4 and the correction resistor 5. As described above, the signal application unit 62a of the first configuration example is configured to be driven by an amplifier.

[2] Second Configuration Example

As shown in FIG. 14, the signal application unit 62b of the second configuration example is different from the signal application unit 62a of the first configuration example shown in FIG. 13 in that a buffer 75 instead of the OP amplifier 73 is arranged. In this case, the output signal of the signal generation unit 72 is given to the input terminal of the buffer 75. The output terminal of the buffer 75 is connected to the gate of the transistor 71. According to the above configuration, the transistor 71 is driven by the buffer 75, so that an AC signal, which is an alternating current voltage, is applied to the series circuit of the shunt resistor 4 and the correction resistor 5. As described above, the signal application unit 62b of the second configuration example has a buffer drive configuration.

[3] Features of Each Configuration Example

According to the first configuration example of the amplifier drive configuration, the source voltage of the transistor 71 is controlled to be constant by the operation of the OP amplifier 73, so that the first configuration example has a merit, compared with the second configuration example of the buffer drive configuration, such that the accuracy of the AC current voltage applied to the series circuit of the shunt resistor 4 and the correction resistor 5 can be improved. On the other hand, according to the second configuration example, there is an advantage that the circuit scale can be suppressed to be a smaller size by using the buffer 75 instead of the OP amplifier 73 as compared with the first configuration example.

As described above, in the current sensor 61 of the present embodiment, the AC signal applied to the series circuit of the shunt resistor 4 and the correction resistor 5 at the time of correction is changed from the AC current to the AC voltage. The sensor 61 includes a resistance value correction circuit 63 capable of performing the same operation as the resistance value correction circuit 17 of the first embodiment, and a power supply circuit 10 for supplying power to the resistance value correction circuit 63. Therefore, also in this embodiment, it is possible to correct the resistance value for detection in the same manner as in the first embodiment, and the same effect as in the first embodiment can be obtained.

Other Embodiments

The present disclosure is not limited to the embodiments that have been described above and illustrated in the drawings, but can freely be modified, combined, or expanded without departing from the gist of the present disclosure.

The numerical values and the like shown in the embodiments described above are examples, and are not limited to those examples.

The specific configurations of the resistance value correction circuits 17 and 63 may not be limited to the configurations described in the above embodiments, and may be appropriately changed as long as they can realize the same functions as these configurations.

The specific configuration of the signal application units 6 and 62 may not be limited to the configuration described in each of the above embodiments, and may be any configuration as long as the feature applies an AC signal to the series circuit of the shunt resistor 4 and the correction resistor 5.

The specific configuration of the first synchronous detection circuit 12 may not be limited to the configuration described in each of the above embodiments, and may be any configuration as long as the feature inputs the signal of the terminal of the shunt resistor 4 and performs synchronous detection at the same frequency as the AC signal to extract and output a signal. The specific configuration of the second synchronous detection circuit 14 may be such that the signal of the terminal of the correction resistor can be input and synchronous detection can be performed at the same frequency as the frequency of the AC signal to extract and output the signal.

The specific configuration of the first power supply generation unit 18 may not be limited to the configuration described in each of the above embodiments, and any configuration may be used as long as it can generate the first power source P1 to have a low voltage with respect to the input power supply Pin by stepping down the input power supply Pin supplied from the outside. Further, the specific configuration of the second power supply generation unit 19 may not be limited to the configuration described in each of the above embodiments, and may be a configuration capable of generating a second power supply P2 different from the first power supply P1.

For example, when the signal application units 6 and 62 are configured so as not to interfere with the operation due to the influence of noise, the LDO 52 may not be arranged for the first power supply generation units 18a, 18b and 18c. Even with such a modified configuration, when the amplifier-driven signal application units 6a and 6b are adopted as the specific configuration of the signal application unit 6, or the amplifier-driven signal application unit 62a is adopted as the specific configuration of the signal application unit 62, the effect of noise reduction is obtained by the operation of the OP amplifiers 23 and 73, so that the influence of noise on the operation of the signal application units 6 and 62 is prevented.

Although the present disclosure has been described in accordance with the examples, it is understood that the present disclosure is not limited to such examples or structures. The present disclosure incorporates various modifications and variations within the scope of equivalents. In addition, various combinations and forms, and further, other combinations and forms including only one element, or more or less than these elements are also within the sprit and the scope of the present disclosure.

What is claimed is:

1. A current sensor for detecting a detection target current using a terminal voltage of a shunt resistor provided in series in a path through which the detection target current flows and a resistance value for current detection corresponding to a resistance value of the shunt resistor, the current sensor comprising:
 a resistance value correction circuit that corrects the resistance value for detection; and
 a power supply circuit that supplies an electric power to the resistance value correction circuit,
 wherein:
 the resistance value correction circuit includes:
  a correction resistor connected in series with the shunt resistor in a path different from the path through which the detection target current flows;
  a signal application unit that applies an alternating current signal to a series circuit of the shunt resistor and the correction resistor;
  a voltage detection unit that detects the terminal voltage of the shunt resistor and a terminal voltage of the correction resistor when the alternating current signal is applied to the series circuit; and
  a correction unit that calculates a resistance value of the shunt resistor based on each detection value of the terminal voltage of the shunt resistor and the terminal voltage of the correction resistor detected by the voltage detection unit, and corrects the resistance value for detection based on a calculated resistance value which is the resistance value of the shunt resistor calculated;
 the power supply circuit includes:
  a first power supply generator that generates a first power supply having a low voltage with respect to an input power supply by stepping down the input power supply supplied from an outside; and
  a second power supply generator that generates a second power supply different from the first power supply; and
 the power supply circuit is configured to supply the first power supply to the signal application unit and to supply the second power supply to the voltage detection unit,
 the signal application unit includes a transistor, a signal generator, and an operational amplifier or a buffer;

the voltage detection unit includes an A/D converter and a synchronous detector or a semiconductor integrated circuit and the correction unit includes a semiconductor integrated circuit or a micro-computer.

2. The current sensor according to claim 1, wherein the first power supply generator includes a switching power source.

3. The current sensor according to claim 2, wherein the switching power source is configured as an insulation power source in which an input side and an output side are insulated from each other.

4. The current sensor according to claim 1, wherein the input power supply is supplied from a main battery that supplies an electric power to a drive unit for traveling a vehicle.

5. The current sensor according to claim 1, wherein the input power supply is supplied from an auxiliary battery that supplies an electric power to an auxiliary equipment of a vehicle.

6. The current sensor according to claim 1, wherein the second power supply generator includes a linear regulator having a low dropout, and generates the second power supply by the linear regulator.

* * * * *